(12) United States Patent
Mitchell et al.

(10) Patent No.: US 8,246,748 B2
(45) Date of Patent: Aug. 21, 2012

(54) METHOD AND APPARATUS FOR COATING SURFACES

(75) Inventors: Daniel B. Mitchell, Port McNicoll (CA); Douglas J. Brown, Midland (CA); Geoffrey G. Harris, Midland (CA)

(73) Assignee: Raytheon Canada Limited, Ottawa, Ontario (CA)

( * ) Notice: Subject to any disclaimer, the term of this patent is extended or adjusted under 35 U.S.C. 154(b) by 1075 days.

(21) Appl. No.: 12/169,971

(22) Filed: Jul. 9, 2008

(65) Prior Publication Data

US 2010/0009074 A1    Jan. 14, 2010

(51) Int. Cl.
*C23C 16/00* (2006.01)

(52) U.S. Cl. .......................... 118/726; 118/727

(58) Field of Classification Search .................. 118/726, 118/727
See application file for complete search history.

(56) References Cited

U.S. PATENT DOCUMENTS

| | | | |
|---|---|---|---|
| 2,410,720 A * | 11/1946 | Dimmick | 118/720 |
| 2,411,715 A * | 11/1946 | Dimmick | 118/720 |
| 3,314,395 A * | 4/1967 | Hemmer | 118/721 |
| 3,486,237 A | 12/1969 | Sawicki | |
| 3,645,771 A | 2/1972 | Ward | |
| 4,600,390 A | 7/1986 | Gobel et al. | |
| 4,817,559 A | 4/1989 | Ciparisso | |
| 4,868,003 A | 9/1989 | Temple et al. | |
| 4,982,696 A * | 1/1991 | Kinoshita et al. | 118/723 VE |
| 5,074,246 A | 12/1991 | Gailliard et al. | |
| 5,164,228 A | 11/1992 | Peralta et al. | |
| 6,051,113 A | 4/2000 | Moslehi | |
| 6,473,247 B1 | 10/2002 | Keller et al. | |
| 6,632,285 B2 | 10/2003 | Wang et al. | |
| 6,786,176 B2 | 9/2004 | Lee et al. | |
| 7,062,348 B1 * | 6/2006 | Folta | 700/118 |
| 7,122,223 B1 * | 10/2006 | Comble et al. | 427/282 |
| 7,513,949 B2 | 4/2009 | Yamazaki et al. | |
| 7,696,065 B2 | 4/2010 | Sato et al. | |

(Continued)

FOREIGN PATENT DOCUMENTS

JP    2003-071650 A    3/2003

OTHER PUBLICATIONS

U.S. Appl. No. 12/017,909 filed Jan. 22, 2008 by inventors Daniel B. Mitchell, Geoffrey G. Harris and Douglas J. Brown for "Method and Apparatus for Coating a Curved Surface", 21 pages of text, 2 pages of drawings.

(Continued)

*Primary Examiner* — Keath Chen
(74) *Attorney, Agent, or Firm* — Lando & Anastasi, LLP

(57) ABSTRACT

A workpiece support member can rotate about an axis relative to a source, and the source can emit a plume of coating material that flows toward the workpiece support member approximately parallel to the axis. A plume-influencing shield can rotate with the workpiece support member, and has a plurality of openings extending therethrough approximately parallel to the general direction of flow of the plume. According to a different aspect, a method involves: rotating a workpiece support member about an axis relative to a source; emitting from the source a plume of coating material that flows toward the workpiece support member approximately parallel to the axis; and influencing the plume with structure that includes a shield rotating with the workpiece support member, the shield having a plurality of openings extending therethrough approximately parallel to the general direction of flow of the plume.

11 Claims, 3 Drawing Sheets

U.S. PATENT DOCUMENTS

| | | | |
|---|---|---|---|
| 2001/0005553 A1 | 6/2001 | Witzman et al. | |
| 2002/0003086 A1 | 1/2002 | Sferlazzo | |
| 2002/0005347 A1 | 1/2002 | Sferlazzo et al. | |
| 2002/0110648 A1 | 8/2002 | Lee et al. | |
| 2002/0110698 A1 | 8/2002 | Singh | |
| 2002/0162740 A1 | 11/2002 | Wang et al. | |
| 2003/0072881 A1 | 4/2003 | Yang et al. | |
| 2003/0077403 A1 | 4/2003 | Darolia et al. | |
| 2003/0082300 A1 | 5/2003 | Todd et al. | |
| 2004/0231594 A1 | 11/2004 | Edwards et al. | |
| 2004/0264352 A1 | 12/2004 | Ohya | |
| 2005/0254148 A1 | 11/2005 | Shimizu | |
| 2006/0130760 A1* | 6/2006 | Zultzke et al. | 118/719 |
| 2007/0155295 A1* | 7/2007 | Igarashi et al. | 451/390 |
| 2007/0157883 A1 | 7/2007 | Zultzke et al. | |
| 2009/0025814 A1 | 1/2009 | Olsson | |
| 2009/0186159 A1 | 7/2009 | Mitchell et al. | |
| 2009/0258141 A1 | 10/2009 | Mitchell et al. | |
| 2009/0258151 A1 | 10/2009 | Mitchell et al. | |
| 2009/0280244 A1 | 11/2009 | Mitchell et al. | |

OTHER PUBLICATIONS

U.S. Appl. No. 12/101,042 filed Apr. 10, 2008 by inventors Daniel B. Mitchell, Geoffrey G. Harris and Douglas J. Brown for "Method and Apparatus for Coating Surfaces", 18 pages of text, 2 pages of drawings.

* cited by examiner

US 8,246,748 B2

METHOD AND APPARATUS FOR COATING SURFACES

FIELD OF THE INVENTION

This invention relates in general to coating techniques and, more particularly, to techniques for coating surfaces.

BACKGROUND

When fabricating an optical component such as a lens, it is very common to form a coating on a surface of the component, where the coating provides desired optical properties and/or physical properties. For example, the coating may provide an anti-reflective (AR) characteristic, a filtering characteristic, physical protection for the component, some other characteristic, or a combination of two or more characteristics. Coatings often include multiple layers of different materials that collectively provide the desired characteristic(s).

One known coating technique is to place a workpiece such as an optical component in a vacuum chamber with an evaporator. The evaporator generates a plume of coating material, which travels to and is deposited on a surface of the workpiece. Where the surface is relatively highly curved, for example highly concave or convex, it is not unusual for a given layer of the coating to have a peripheral region that is as much as 30% to 50% thinner than a central region of that layer, or even more than 50% thinner. This is due in part to the fact that, when a surface is highly curved, the plume of coating material will typically impinge on a central portion of the surface approximately perpendicular to the surface, and thus with a low angle of incidence, but will impinge on a peripheral portion of the same surface with a high angle of incidence. As a result, more coating material will be deposited on the central portion of the surface than on the peripheral portion. Consequently, the resulting layer of coating material will be significantly thinner in its peripheral region than in its central region.

In the case of an optical component, variations in the thickness of a coating layer can affect the optical performance of the coating. For example, if the coating is designed to pass light from a 1064 nm laser, it may do so properly in its central region, where the thicknesses are correct. But a 35% thickness variation in the peripheral region can cause a corresponding variation in the wavelengths passed in the peripheral region, such that the peripheral region passes wavelengths of about 676 nm to 709 nm, and not the intended wavelength of 1064 nm.

A further consideration is that different layers in the same coating often have different variations in thickness. For example, one layer may be 30% thinner in a peripheral region than in a central region, while another layer may be 50% thinner in a peripheral region than in a central region. Consequently, the ratios of thicknesses of different layers in the peripheral region of the coating can be different from the ratios of the thicknesses of those same layers in the central region.

Thus, even assuming that the layers all have the proper thicknesses and ratios of thickness in the central region of the coating, the thicknesses and the ratios of thicknesses in the peripheral region will typically not be correct. As a result, the coating may provide desired characteristics in the central region, but may fail to provide these desired characteristics in the peripheral region, or may at least exhibit a degradation of the desired characteristics in the peripheral region. Consequently, although pre-existing coating techniques have been generally adequate for their intended purposes, they have not been entirely satisfactory in all respects.

BRIEF DESCRIPTION OF THE DRAWINGS

A better understanding of the present invention will be realized from the detailed description that follows, taken in conjunction with the accompanying drawings, in which.

DETAILED DESCRIPTION

Figure 1:
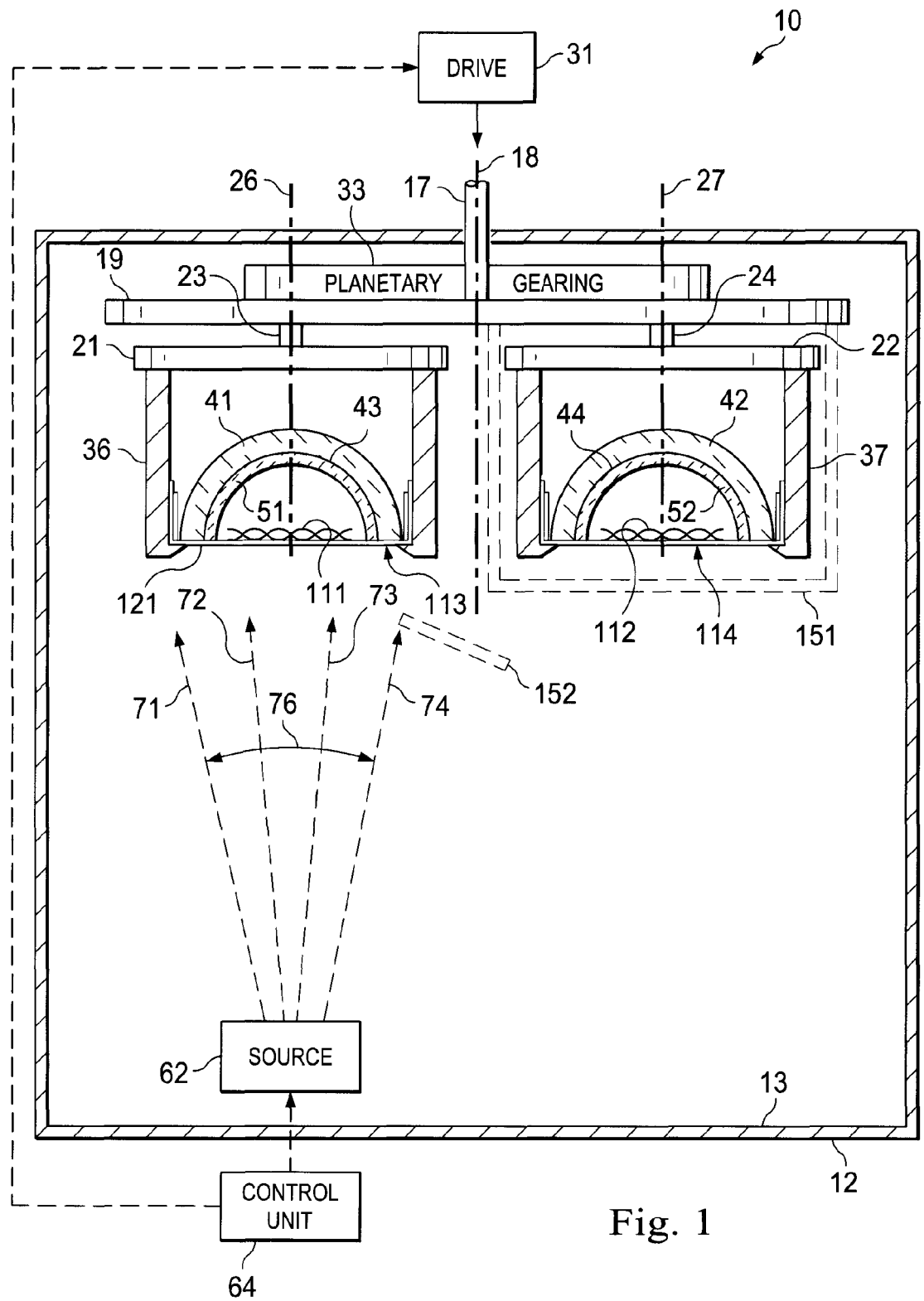
FIG. 1 is a diagrammatic sectional side view of a coating apparatus that embodies aspects of the invention.

FIG. 1 is a diagrammatic sectional side view of a coating apparatus 10 that embodies aspects of the invention. The coating apparatus 10 includes a housing 12 with a chamber 13 therein. During a typical coating operation, a vacuum is maintained in the chamber 13 by a conventional and not-illustrated vacuum pump. The housing 12 supports a primary axle 17 for rotation about a primary vertical axis 18. A support part 19 is supported on the axle 17 within the chamber 13 for rotation with the axle about the axis 18. In the disclosed embodiment, the support part 19 is disk-shaped, but it could alternatively have any other suitable shape.

The support part 19 rotatably supports two workpiece support members 21 and 22. More specifically, two additional vertical axles 23 and 24 are each rotatably supported on the support part 19. These additional axles are spaced circumferentially from each other about the primary axle 17, and each rotate about a respective additional vertical axis 26 or 27. The two support members 21 and 22 are each supported on a respective one of the axles 23 and 24 for rotation therewith about the associated axis 26 or 27. In the disclosed embodiment, the support members 21 and 22 are disk-shaped, but they could each alternatively have any other suitable shape. Although FIG. 1 shows two workpiece support members 21 and 22 with respective axles 23 and 24, it would alternatively be possible to have one or more additional workpiece support members with respective axles, where the axles for all workpiece support members are spaced circumferentially from each other about the primary axle 17.

A drive mechanism 31 such as an electric motor is coupled to the axle 17, in order to effect rotation of the axle 17 and the support part 19. A planetary gearing mechanism of a well-known type is shown diagrammatically at 33 and, in response to rotation of the support part 19 with respect to the housing 12, effects rotation of the additional axles 23 and 24 with respect to the support part 19. Thus, the workpiece support members 21 and 22 each undergo planetary movement about the primary axis 18 with respect to the housing 12. Each of the workpiece support members 21 and 22 has thereon a respective workpiece support fixture 36 or 37. The workpiece support fixtures 36 and 37 will be described in more detail later. The primary axle 17, the support part 19, the additional axles 23 and 24, the workpiece support members 21 and 22, and the workpiece support fixtures 36 and 37 collectively serve as a workpiece support mechanism. For simplicity and clarity, FIG. 1 shows each of the workpiece support members 21 and 22 with just one workpiece support fixture 36 or 37 thereon. However, it would alternatively be possible for each of the workpiece support members 21 and 22 to have a plurality of workpiece support fixtures thereon.

Each of the workpiece support fixtures 36 and 37 is configured to removably support a respective workpiece 41 or 42. The workpieces 41 and 42 each have a highly-curved concave surface 43 or 44 on a lower side thereof. The apparatus 10 is used to form respective coatings 51 and 52 on the concave surfaces 43 and 44 of the workpieces 41 and 42, in a manner discussed later. In the embodiment of FIG. 1, the workpieces 41 and 42 with the coatings 51 and 52 are each an optical component of a well-known type, such as a lens. Therefore, they are described here only briefly, to the extent necessary to facilitate an understanding of various aspects of the present invention.

For clarity and simplicity, the workpieces 41 and 42 are identical in the embodiment of FIG. 1. However, it would alternatively be possible for the workpieces 41 and 42 to be different, such that the apparatus 10 simultaneously coats different types of workpieces. A further consideration is that, although the surfaces 42 and 44 in the embodiment of FIG. 1 are both steeply curved concave surfaces, they could alternatively be less steeply curved surfaces, and/or could be convex or have some other shape. Still another consideration is that, although the illustrated workpieces 41 and 42 are optical components, the coating apparatus 10 is not limited to use for coating optical components, but instead can be used for coating any of a wide variety of other types of workpieces.

It would be possible for each of the coatings 51 and 52 to be only a single layer of a single material. But in the embodiment of FIG. 1, the coatings 51 and 52 each happen to include a plurality of different layers that are not separately illustrated, involving the use of one material for some layers, another material for other layers, and so forth. By interleaving different layers of different materials in a known manner, the coatings 51 and 52 can each be given certain desired optical characteristics. For example, the coatings 51 and 52 may each provide an anti-reflective (AR) characteristic that causes little or no reflection of a selected range of wavelengths, such as a range corresponding to visible light.

In some cases, the multi-layer coatings 51 and 52 will be configured in a known manner to provide a combination of two or more desired optical characteristics. For example, a given coating might provide an anti-reflection characteristic as to one range of wavelengths, such as visible light, while also filtering out wavelengths in a different range of wavelengths, such as a range associated with laser energy.

As another example, if the optical workpiece 41 or 42 happens to be made of a relatively soft material that was selected because it provides certain desirable optical properties, the coating 51 or 52 may be configured to be physically harder than the associated workpiece 41 or 42, in order to help physically protect the material of the workpiece 41 or 42. Thus, a given coating 51 or 52 may provide an anti-reflection characteristic, while also being physically harder than the material of the associated workpiece 41 or 42, in order to help physically protect the workpiece. The discussion here of anti-reflection characteristics, filtering characteristics and hardness characteristics is merely exemplary. The coatings 51 and 52 may each provide some or all of these characteristics, and/or any of a variety of other characteristics, separately or in combination.

The coating apparatus 10 includes a source 62 within the housing 12, in a lower portion of the chamber 13. The source 62 is spaced downwardly from the support part 19. The source 62 and the drive mechanism 31 are both controlled by a control unit 64 of a known type. Although FIG. 1 shows only a single source 62, it would alternatively be possible to provide two or more sources in the apparatus 10. In the embodiment of FIG. 1, the source 62 is spaced radially from the primary axis 18, and is positioned approximately below the path of travel of the workpiece support members 21 and 22. However, it would alternatively be possible for the source 62 to be positioned at any of a variety of other locations within the housing 12.

The source 62 is a device of a type well known in the art, and is therefore described here only briefly. In the disclosed embodiment, the source 62 is a type of device commonly referred to as an electron beam evaporator. However, the source 62 could alternatively be any other suitable type of device. The source 62 contains two or more different materials that will be used to form respective layers in each of the multi-layer coatings 51 and 52, and the source can selectively evaporate any of these different materials. At any given point in time, the source 62 will typically be evaporating only one of the multiple materials that it contains. But in some situations, the source may simultaneously evaporate two or more of these different materials.

When the source 62 is evaporating a material, a plume of the evaporated material travels upwardly, as indicated diagrammatically by arrows 71-74. The plume 71-74 has a dispersion angle 76. The plume 71-74 from the source 62 coats the surfaces 43 and 44 on the workpieces 41 and 42 as the workpieces pass above the source 62.

Figure 2:
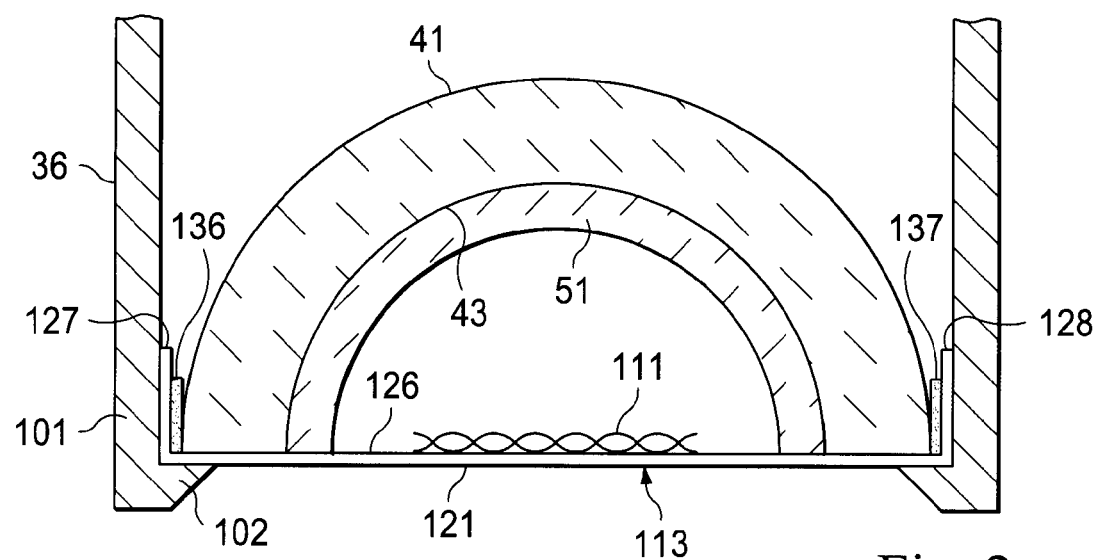
FIG. 2 is a diagrammatic fragmentary sectional side view, in an enlarged scale, of a portion of the apparatus of FIG. 1, including a workpiece support fixture and a workpiece.

FIG. 2 is a diagrammatic fragmentary sectional side view, in an enlarged scale, of a portion of the structure shown in FIG. 1, including the workpiece support fixture 36 and the workpiece 41. The workpiece support fixture 36 includes a cylindrical annular sleeve 101, with an inwardly-projecting annular flange 102 at its lower end. Although the sleeve 101 and flange 102 in the disclosed embodiment are cylindrical, they could alternatively have any other suitable shape, for example in dependence on the shape of the particular workpiece that is to be supported. It is desirable that the apparatus 10 form a coating that covers the entire curved surface 43. It will be noted that, in FIG. 2, the surface 43 on the lower side of the workpiece 41 is approximately semispherical, and has a diameter that is less than the diameter of the circular opening through the flange 102. Consequently, the entire curved surface 43 is exposed to the plume 71-74 of coating material (FIG. 1), and the flange 102 does not block or otherwise interfere with coating of any portion of the curved surface.

It is also desirable that the coatings 51 and 52 each have a thickness that is relatively uniform across the entire coating. It will be noted from FIG. 1 that, in the absence of any corrective measure, the upwardly-traveling plume 71-74 of coating material would impinge on a central portion of the surface 43 approximately perpendicular thereto and thus with a low angle of incidence, but would impinge on a peripheral portion of the same surface with a high angle of incidence. As a result, in the absence of any corrective measure, more coating material would be deposited on the central portion of the surface than on the peripheral portion. That is, the resulting layer of coating material would be significantly thinner in its peripheral region than in its central region. However, in the embodiment of FIG. 1, in order to achieve more uniformity in the thickness of the coating 51, a corrective measure is provided in the form of a perforated shield 111.

In more detail, and with reference to FIGS. 1 and 2, the perforated shield 111 is supported below the curved surface 43 of the workpiece 41 by a shield support arrangement 113. Similarly, a further perforated shield 112 is supported below the curved surface 44 on the workpiece 42 by a shield support arrangement 114. In the embodiment of FIG. 1, the shields 111 and 112 are effectively identical, and the shield support arrangements 113 and 114 are effectively identical. Therefore, only the shield 111 and shield support arrangement 113 will be described below in detail.

Figure 3:
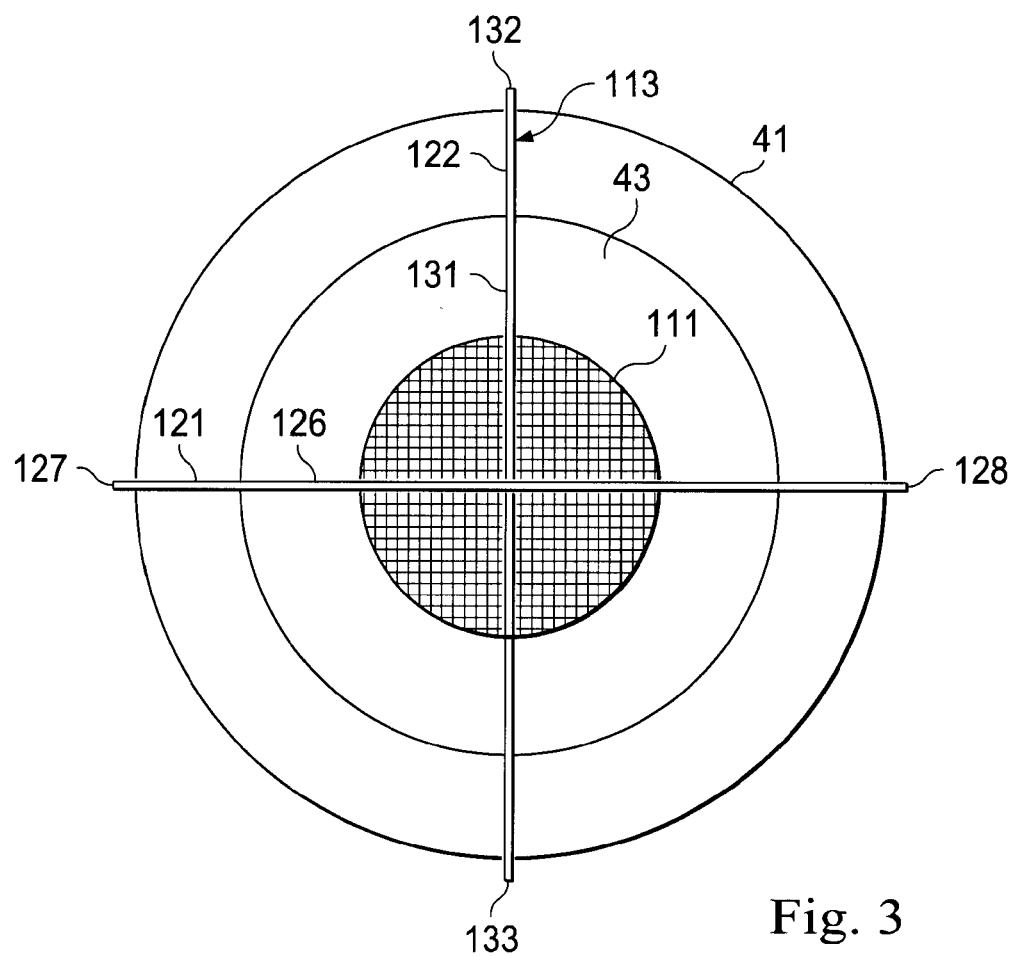
FIG. 3 is a diagrammatic bottom view of a workpiece, a perforated shield and a shield support arrangement that are components of the embodiment of FIGS. 1 and 2.

FIG. 3 is a diagrammatic bottom view of the workpiece 41, the perforated shield 111 and the shield support arrangement 113 from FIGS. 1 and 2. For clarity and simplicity, the coating 51 and the workpiece support fixture 36 have been omitted in FIG. 3. With reference to FIGS. 2 and 3, the shield support arrangement 113 includes two elongate metal wires 121 and 122, which each have a very small diameter. Although the embodiment of FIGS. 1-3 uses two wires 121 and 122, it would alternatively be possible to use a different number of wires. In the illustrated embodiment, the wires 121 and 122 are each made of stainless steel, and each have a diameter of about 0.0055 inches. However, it would alternatively be possible to use wires that are made of some other suitable material, or that have some other diameter. In fact, it would be possible to use a shield support arrangement made from something other that wires.

With reference to FIGS. 2 and 3, the wire 121 has a horizontally-extending central portion 126, and two end portions 127 and 128 that are each bent to extend upwardly at a right angle with respect to the central portion 126. Similarly, with reference to FIG. 3, the wire 122 has a horizontally-extending central portion 131, and two end portions 132 and 133 that are bent to extend upwardly at a right angle to the central portion 131. The wires 121 and 122 are oriented so that their central portions 126 and 131 extend perpendicular to each other. The central portions 126 and 131 each have a length that is slightly longer than the outside diameter of the workpiece 41.

With reference to FIG. 2, a short strip of a flexible, vacuum-compatible tape 136 is provided, and releasably secures the end portion 127 of the wire 121 to a cylindrical inner surface of the workpiece support fixture 36. A similar short strip of tape 137 is used to secure the opposite end portion 128 of the wire 121 to the cylindrical inner surface of the workpiece support fixture 36. Two other short strips of the tape, which are not visible in the drawings, are used to respectively secure the end portions 132 and 133 of the wire 122 to the inner surface of the workpiece support fixture 36. Each strip of tape includes an elongate flexible strip or carrier, and an adhesive layer on one side of the flexible strip.

In the illustrated embodiment, these four strips of tape are each a product that is obtained commercially under the trademark KAPTON® from C.S. Hyde Company, Inc. of Lake Villa, Ill. KAPTON® is commercially available in a variety of widths, and with a variety of different levels of adhesion. The particular tape selected for use will depend on a variety of different factors, such as the size and weight of the particular workpiece 41 that is to be coated.

Although the illustrated embodiment uses KAPTON® tape, it would alternatively be possible to use any other suitable tape, or some other suitable material. Also, depending on various factors, such as the size of the workpiece 41, the diameter and stiffness of the wires 121 and 122, and the size and weight of the shield 111, it may be possible to optionally omit the strips of tape, including the strips shown at 136 and 137.

With reference to FIGS. 2 and 3, the perforated shield 111 is a flat and approximately circular piece of wire mesh material. The openings between adjacent wires serve as the perforations through the shield 111. In the embodiment of FIGS. 1-3, the shield 111 is a stainless steel wire mesh material purchased commercially from Ferrier Wire Goods of Toronto, Ontario as Type 304 wire mesh, 80×80, woven. The wires in this particular material have a diameter of about 0.0055 inches, and the space between adjacent wires is about 0.007 inches. However, it would alternatively be possible to use any other suitable perforated material, such as filter cloth.

As evident from the bottom view of FIG. 3, the circular shield 111 in the illustrated embodiment has a diameter that is approximately half the diameter of the curved surface 43 that is to be coated. The circular shield 111 is supported on the wires 121 and 122 so that, in the bottom view of FIG. 3, the shield 111 is approximately concentric with the surface 143. In order to avoid movement of the shield 111 relative to the workpiece 41 and the wires 121 and 122, the wires 121 and 122 may each be threaded through a portion of the wire mesh of the shield 111. Alternatively, the wire mesh of the shield 111 could be formed so that two of the wires integral to the wire mesh are significantly longer than all of the other wires in the mesh, and serve as the support wires 121 and 122.

During a coating operation, the workpiece 41 undergoes planetary movement (as explained above), and the wires 121 and 122 and the shield 111 undergo this same planetary movement move with the workpiece. Stated differently, the shield 111 and the wires 121 and 122 do not move relative to the workpiece 41 during a coating operation. With reference to FIG. 1, as the plume 71-74 of coating material travels upwardly, portions of the plume will not encounter the shield 111, and will travel to and be deposited on an annular peripheral portion of the curved surface 43 that is being coated. Other portions of the plume 71-74 will encounter the shield 111, but the perforations in the shield will permit a portion of that coating material to pass through the shield and then be deposited on a central region of the surface 43. In the illustrated embodiment, the shield 111 passes approximately 50% of the coating material arriving at the shield. The shield 111 is sufficiently thin so that the perforations therein do not tend to collimate the coating material that flows through the perforations. Since the shield 111 is spaced from the workpiece surface 43, and since the shield and workpiece are rotating relative to the moving plume of coating material, the coating material that does pass through the shield tends to be diffused somewhat. Consequently, there is no tendency for the resulting coating to have thickness variations that image the perforated and non-perforated portions of the shield.

As discussed above, if the perforated shield 111 was not present while the coating 51 was being formed on the curved surface 43, the annular peripheral portion of the coating would be as much as 40% thinner than the central portion of the coating. In contrast, when the perforated shield 111 is present during formation of the coating 51, the coating 51 will be relatively uniform in thickness across its entirety, with variations in thickness being less than about 2%.

In the embodiment of FIGS. 1-3, the support fixture 36 supports both the workpiece 41 and the associated shield 111. Similarly, the support fixture 37 supports both the workpiece 42 and the associated shield 112. Alternatively, however, other structure could be provided to support the shields 111 and 112. For example, a not-illustrated annular member could be provided on the workpiece support member 21, could concentrically encircle the fixture 36, and could support the shield support 113 and the shield 111 below the workpiece 41. Similarly, a not-illustrated annular member could be provided on the workpiece support member 22, could concentrically encircle the fixture 37, and could support the shield support 114 and the shield 112 below the workpiece 42.

For clarity and simplicity, FIG. 1 shows only the shields 111 and 112 that are supported on and rotate with the workpiece support members 21 and 22. However, it would alternatively be possible to other shields in addition to the shields 111 and 112. For example, as shown diagrammatically by broken lines in FIG. 1, a shield 151 could be supported on the support part 19, so that it is disposed below the workpiece 42. The shield 151 would rotate with the part 19, but the workpiece 42 and shield 112 would rotate relative to the shield 151. Similarly, as also shown by broken lines in FIG. 1, a stationary shield 152 could be supported between the source 62 and the workpiece support mechanism. The shield 152 and/or the shield 151 would serve to provide a degree of rough, preliminary plume shaping, and then the shield 111 or 112 would then provide an additional level of influence on the plume that is customized for the particular workpiece.

Figure 4:
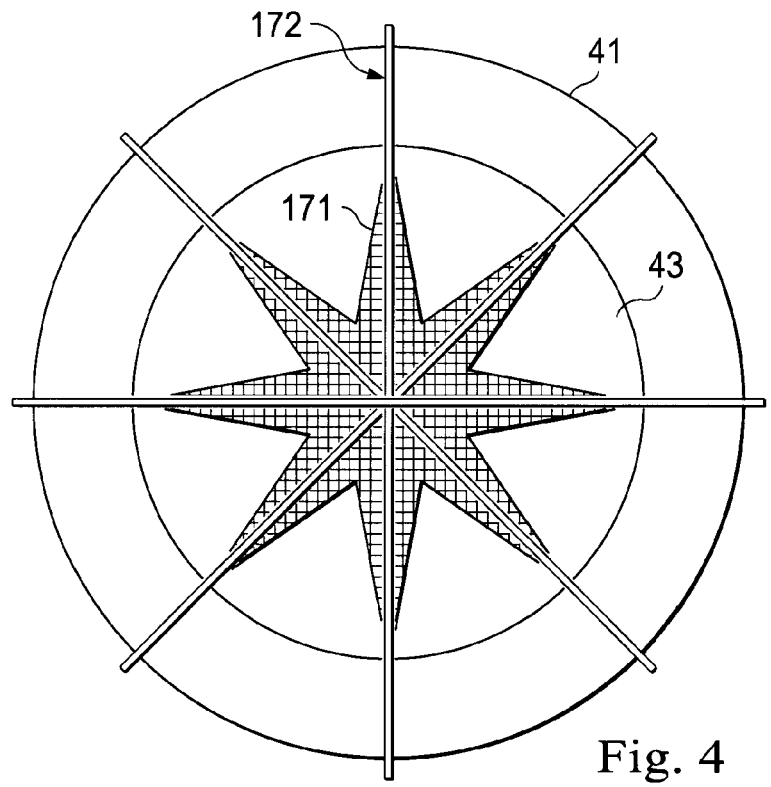
FIG. 4 is a diagrammatic bottom view similar to FIG. 3, but showing the workpiece with a shield and a shield support arrangement that are an alternative embodiments of the shield and shield support arrangement shown in FIG. 3.

FIG. 4 is a diagrammatic bottom view similar to FIG. 3, but showing the workpiece 41 with a shield 171 and shield support arrangement 172 that are an alternative embodiment of the shield 111 and shield support arrangement 113 of FIG. 3. The primary difference is that the shield 171 has the shape of a star, rather than a circle. In particular, the shield 171 has the shape of a star with eight pointed legs. The point at the outer end of each leg is located adjacent an outer peripheral edge of the curved surface 43. A further difference is that, although each support wire for the shield 171 is similar to the support wire shown at 121 in FIG. 3, the shield support arrangement 172 has four support wires rather than two support wires.

Figure 5:
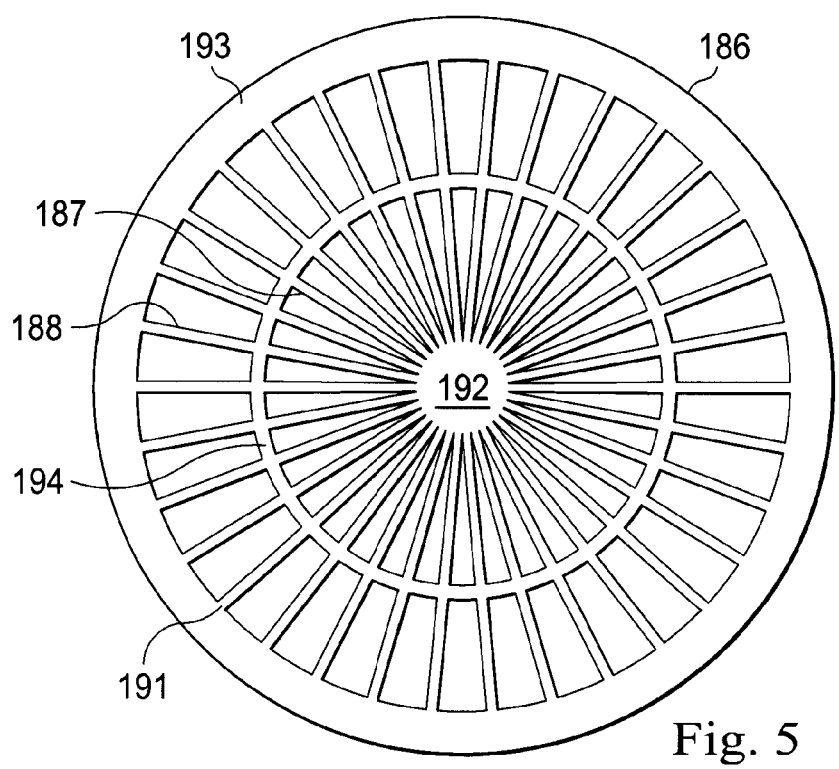
FIG. 5 is a diagrammatic bottom view of a further perforated shield that can be used in place of the shield and shield support arrangement shown in FIG. 3.

FIG. 5 is a diagrammatic bottom view of a further perforated shield 186, which can be used in place of the shield 111 and the shield support arrangement 113 shown in FIG. 3. The shield 186 is made from a very thin piece of a platelike material. In FIG. 5, the shield 186 is made from a thin piece of metal, such as stainless steel, but it could alternatively be made of any other suitable material. The shield 186 has an outside diameter that is approximately equal to the outside diameter of the workpiece 41 (FIG. 3). The shield 186 has a plurality of sector-shaped openings therethrough, including an inner ring of sector-shaped openings 187, and an outer ring of sector-shaped openings 188.

In a sense, the shield 186 has approximately the shape of a wheel, with a plurality of spokes 191 that extend radially outwardly in respective different directions, from a hub 192 to a circumferential rim 193. A circular rib 194 has a diameter that is approximately half the diameter of the rim 193. The circular rib 194 is concentric to the hub 192, and is integrally coupled to each spoke 191, at a location about halfway along the radial length of each spoke. For clarity, the widths of the rib 194 and the spokes 191 are exaggerated in FIG. 5. The spokes 191 and the rib 194 each have a very thin width. Also, the number of spokes 191 could be different. For example, the number of spokes could be larger.

In operation, the shield 171 of FIG. 4 and the shield 186 of FIG. 5 do not move relative to the associated workpiece. Instead, each moves with the associated workpiece, and each reduces the amount of coating material deposited in the central region of a curved surface relative to the amount deposited in the peripheral portion of that surface, thereby yielding greater uniformity in thickness of the resulting coating.

Although FIG. 5 shows a single circular rib 194, it would alternatively be possible to provide a plurality of such ribs, and/or to provide a rib or ribs with a shape that is other than circular. For example, there might be a plurality of concentric circular ribs, and the radial spacing between them might be either uniform or non-uniform. As another example, a rib might be circular, but offset so that it is not concentric to the axis of rotation of the workpiece. As still another example, a rib might have an oval shape, or an egg shape, rather than being circular.

With reference to FIGS. 3 and 4, the shields 111 and 171 happen to be configured so that the size and density of the perforations are approximately uniform throughout the shield. However, it would alternatively be possible to vary the sizes and/or the density of the perforations in different portions of a shield. For example, the shield 111 might have relatively small perforations in the central region of the shield, and slightly larger perforations near the peripheral edge of the shield.

The disclosed shields 111, 112, 171 and 186 each have a configuration that is customized to a particular workpiece surface that is to be coated. The customized configuration may involve factors such as the shape of the peripheral edge of the shield, the sizes of the perforations in the shield, and/or the locations of the perforations.

In the drawings, the surfaces to be coated are depicted as relatively highly curved concave surfaces. However, the invention is not limited to highly-curved concave surfaces, and could also be used to coat a wide variety of other surface shapes, including but not limited to convex surfaces and flat surfaces.

Although selected embodiments have been illustrated and described in detail, it should be understood that a variety of substitutions and alterations are possible without departing from the spirit and scope of the present invention, as defined by the claims that follow.

What is claimed is:

1. An apparatus comprising:
   a workpiece support that includes a workpiece support member supported by the workpiece support for rotation about an axis;
   a source that is spaced from said workpiece support and that emits a plume of coating material that flows away from said source toward said workpiece support approximately parallel to said axis, rotation of said workpiece support member about said axis being rotation with respect to said source;
   a shield having a plurality of openings that extend therethrough approximately parallel to a general direction of flow of a plume away from said source, said shield influencing the flow of said plume of coating material from said source; and
   a shield support coupled to and supported on said workpiece support member for rotation therewith about said axis, said shield support including a plurality of elongate support elements that extend across said workpiece support member traverse to said axis and that have ends coupled to said workpiece support member, said shield being supported on top of said shield support.

2. An apparatus according to claim 1, wherein said elongate support elements each include a length of wirelike material.

3. An apparatus according to claim 2, including a workpiece that is supported on said workpiece support member for rotation therewith about said axis and that has a curved surface on a side thereof facing said source, said shield being disposed between said curved surface and said source; and
   wherein said ends of each said elongate support element are coupled to one of said workpiece and said workpiece support member by a flexible strip having an adhesive layer on one side thereof.

4. An apparatus according to claim 2, wherein said ends of each said elongate support element extend at an angle with respect to a remainder thereof.

5. An apparatus according to claim 1, wherein said shield includes a piece of mesh material that defines said plurality of openings.

6. An apparatus according to claim 5, wherein said mesh material is a wire mesh material.

7. An apparatus according to claim 5, wherein said piece of mesh material is approximately circular.

8. An apparatus according to claim 7, including a workpiece that is supported on said workpiece support member for rotation therewith about said axis and that has a curved surface on a side thereof facing said source, said circular piece of mesh material being smaller than said curved surface, and being disposed between said curved surface and said source.

9. An apparatus according to claim 1, wherein said workpiece support includes a support part supported for rotation with respect to said source about a principal axis that is spaced from and extends approximately parallel to the axis of rotation of said workpiece support member, said workpiece support member being supported on said support part for rotation with respect thereto, said workpiece support member and said shield undergoing planetary movement about said principal axis with respect to said source.

10. An apparatus according to claim 1, including a further shield supported by said workpiece support and arranged so that said workpiece support member and said shield thereon rotate relative to said further shield.

11. An apparatus according to claim 1, including a workpiece supported by said workpiece support member and having thereon a surface, and said shield having a configuration that is a function of the shape of said surface on said workpiece.

* * * * *